United States Patent
Park et al.

(10) Patent No.: US 8,674,363 B2
(45) Date of Patent: Mar. 18, 2014

(54) ORGANIC LIGHT EMITTING DISPLAY APPARATUS

(75) Inventors: Sun Park, Yongin (KR); Do-Hyung Ryu, Yongin (KR)

(73) Assignee: Samsung Display Co., Ltd., Suwon-si, Gyeonggi-do (KR)

( * ) Notice: Subject to any disclaimer, the term of this patent is extended or adjusted under 35 U.S.C. 154(b) by 137 days.

(21) Appl. No.: 13/315,568

(22) Filed: Dec. 9, 2011

(65) Prior Publication Data

US 2013/0026476 A1 Jan. 31, 2013

(30) Foreign Application Priority Data

Jul. 28, 2011 (KR) .................. 10-2011-0075216

(51) Int. Cl.
*H01L 29/04* (2006.01)
*H01L 31/20* (2006.01)
*H01L 31/036* (2006.01)
*H01L 31/0376* (2006.01)

(52) U.S. Cl.
USPC .................. 257/59; 257/40; 257/72

(58) Field of Classification Search
USPC .................. 257/40, 59, 72, E33.053
See application file for complete search history.

(56) References Cited

U.S. PATENT DOCUMENTS

| 2007/0045841 A1* | 3/2007 | Cho et al. .......... 257/737 |
| 2008/0032431 A1* | 2/2008 | Hsu et al. .......... 438/29 |
| 2013/0001563 A1* | 1/2013 | Park et al. .......... 257/59 |

FOREIGN PATENT DOCUMENTS

| JP | 2009-288540 | 12/2009 |
| KR | 10-2007-0031552 A | 3/2007 |
| KR | 10-2007-0097824 A | 10/2007 |

\* cited by examiner

*Primary Examiner* — Phuc Dang (74) *Attorney, Agent, or Firm* — Lee & Morse, P.C.

(57) ABSTRACT

An organic light emitting display apparatus includes a substrate on which a display area and a non-display area are defined, a first electrode on the substrate, an intermediate layer on the first electrode, the intermediate layer includes an organic emission layer, a second electrode on the intermediate layer, a plurality of pad units on the non-display area, and an insulating layer on the pad units. The insulating layer includes contact holes overlapping upper surfaces of the pad units and grooves adjacent to the contact holes.

17 Claims, 7 Drawing Sheets

ORGANIC LIGHT EMITTING DISPLAY APPARATUS

CROSS-REFERENCE TO RELATED PATENT APPLICATION

This application claims the benefit of Korean Patent Application No. 10-2011-0075216, filed on Jul. 28, 2011, in the Korean Intellectual Property Office, the disclosure of which is incorporated herein in its entirety by reference.

BACKGROUND

Display apparatuses are being formed as thin flat panel display apparatuses that may be portable. Among the flat panel display apparatuses, organic light emitting display apparatuses are self-emissive display apparatuses that are considered as next generation display apparatuses due to, e.g., their wide viewing angles, high contrast, and fast response speeds.

SUMMARY

Embodiments may be realized by providing an organic light emitting display apparatus including a substrate on which a display area and a non-display area are defined, a first electrode disposed on the substrate, an intermediate layer disposed on the first electrode, the intermediate layer includes an organic emission layer, a second electrode disposed on the intermediate layer, a plurality of pad units disposed on the non-display area, and an insulating layer disposed on the pad units. The insulating layer includes contact holes formed to overlap with upper surfaces of the pad units and grooves adjacent to the contact holes.

The organic light emitting display apparatus may further include a driving circuit unit disposed on the insulating layer and electrically connected to the pad units via the contact holes, and an anisotropic conductive film disposed between the insulating layer and the driving circuit unit. A plurality of the contact holes may be formed and the groove may be disposed between two adjacent contact holes.

The anisotropic conductive film may include an insulating film and conductive balls, and the uppermost portion of the groove may be greater in size than each of the conductive balls. The anisotropic conductive film may include an insulating film and conductive balls, and at least one conductive ball may be received in each of the grooves. The grooves may be formed through the insulating layer. The grooves may be formed in the insulating layer by a predetermined thickness of the insulating layer. Side surfaces of the grooves may be surrounded by the insulating layer.

The insulating layer may be formed to cover edges of the pad units. The anisotropic conductive film may include an insulating film and conductive balls. The driving circuit unit may include bumps, and the conductive balls may be disposed between the bumps and the upper surfaces of the pad units. A plurality of the contact holes may be formed and a plurality of the grooves may be formed, and a plurality of grooves may be disposed between two adjacent contact holes. The insulating layer may further include an opening that overlaps with an upper surface of the first electrode, and the intermediate layer may be disposed to correspond to the opening.

The organic light emitting display apparatus may further include a thin film transistor disposed on the substrate and electrically connected to the first electrode, the thin film transistor may include an active layer, a source electrode, a drain electrode, and a gate electrode.

The pad units may be formed of a material that is the same as the material forming the source electrode or the drain electrode, and may be formed from the same layer as that of the source electrode or the drain electrode. The first electrode and the gate electrode may be formed on the same layer. The gate electrode may include a first conductive layer and a second conductive layer formed on the first conductive layer, and the first electrode may be formed of the same material as a material forming the first conductive layer. The first electrode may include a transparent conductive material.

BRIEF DESCRIPTION OF THE DRAWINGS

Features will become apparent to those of ordinary skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Hereinafter, embodiments will be described in detail with reference to accompanying drawings.

Figure 1:
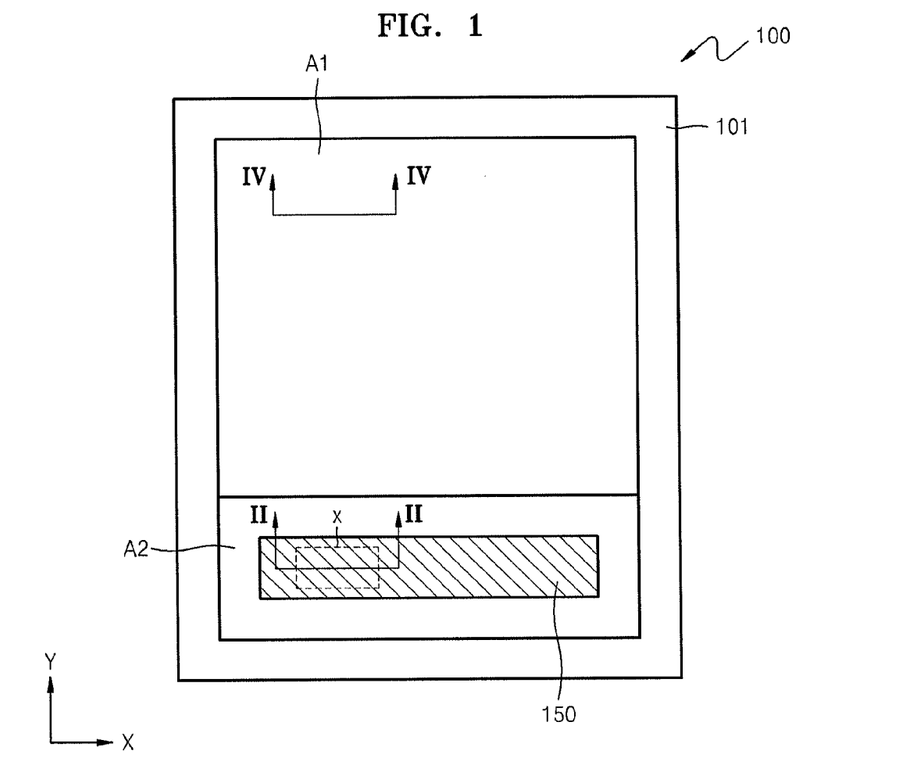
FIG. 1 illustrates a schematic plan view of an organic light emitting display apparatus, according to an exemplary embodiment.
Figure 2:
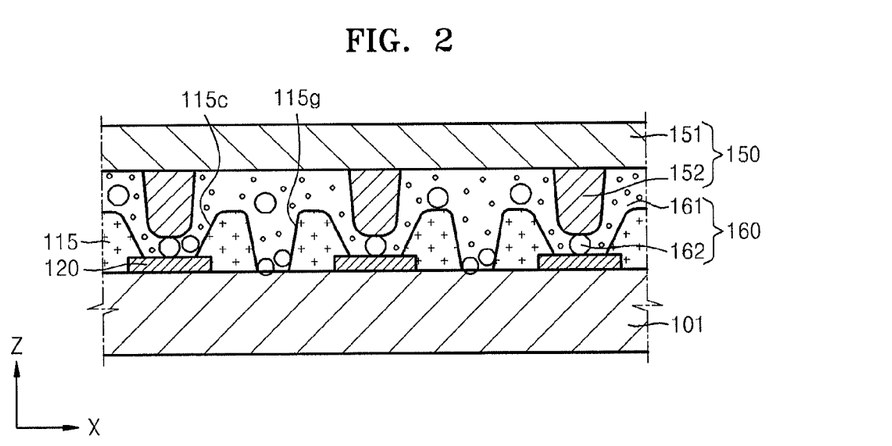
FIG. 2 illustrates a cross-sectional view of the organic light emitting display apparatus taken along line II-II of FIG. 1.
Figure 3:
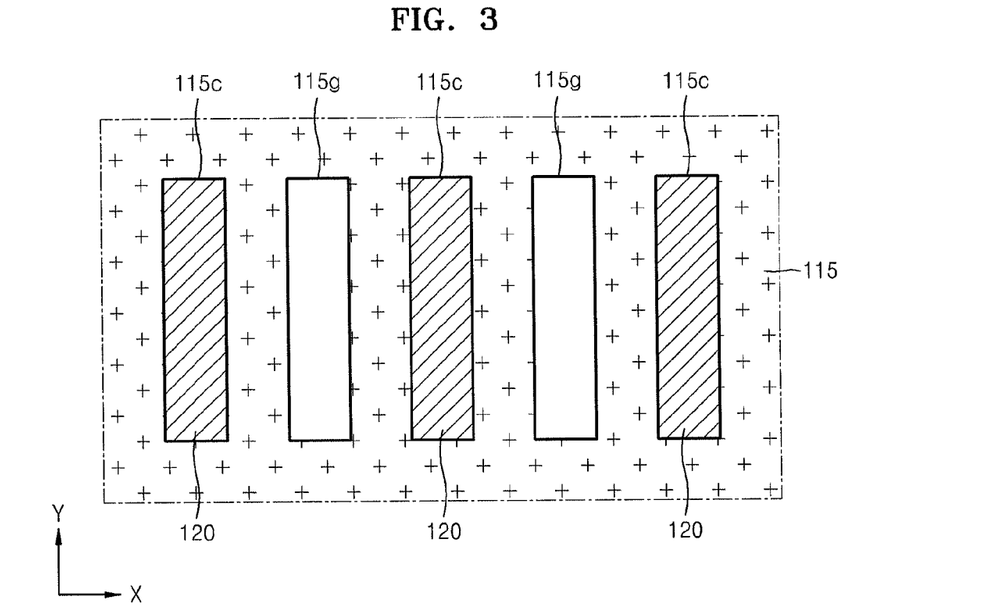
FIG. 3 illustrates an expanded view of a region X shown in FIG. 1.
Figure 4:
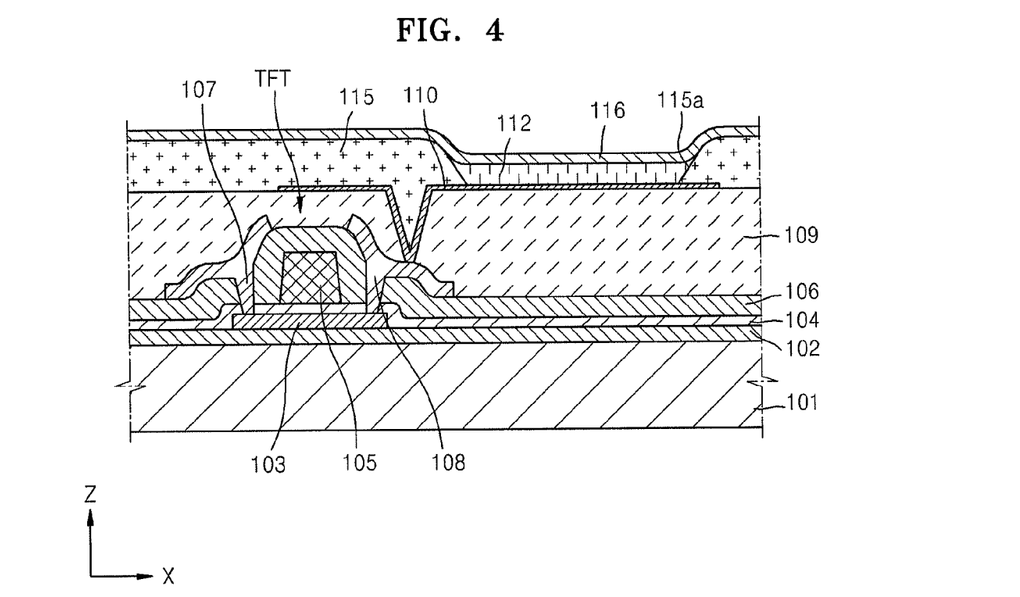
FIG. 4 illustrates a cross-sectional view of the organic light emitting display apparatus taken along line IV-IV of FIG. 1.

FIG. 1 illustrates a schematic plan view of an organic light emitting display apparatus 100 according to an exemplary embodiment, FIG. 2 illustrates a cross-sectional view of the organic light emitting display apparatus 100 taken along line II-II of FIG. 1, FIG. 3 illustrates an expanded view of a region X shown in FIG. 1, and FIG. 4 illustrates a cross-sectional view of the organic light emitting display apparatus 100 taken along line IV-IV of FIG. 1.

Referring to FIGS. 1 through 4, the organic light emitting display apparatus 100 may include a substrate 101, a first electrode 110, an intermediate layer 112, a second electrode 116, pad units 120, an insulating layer 115, a driving circuit unit 150, and an anisotropic conductive film (ACF) 160.

The substrate 101 may be formed of, e.g., a transparent glass material mainly including $SiO_2$. However, embodiments are not limited thereto, e.g., the substrate 101 may be formed of a transparent plastic material. A plastic substrate may be formed of an organic insulating material such at least one of polyethersulfone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), and cellulose acetate propionate (CAP). Alternatively, the substrate 101 may be formed of metal, e.g., may be formed as a metal foil.

A display area A1 and a non-display area A2 may be defined on the substrate 101. FIG. 1 shows that the non-display area A2 is disposed on a side of the display area A1. However, embodiments are not limited thereto, e.g., the non-display area A2 may be disposed on sides of the display area A1 that face each other, or may be disposed to surround the display area A1.

The display area A1 may include a plurality of sub-pixels (not shown) that are capable of generating visible rays that a user may recognize. In each of the sub-pixels, the first electrode 110, the intermediate layer 112, and the second electrode 116 may be formed, e.g., as described below with reference to FIG. 4.

A plurality of pad units 120 may be arranged on the non-display area A2. The pad units 120 may transfer electrical signals or electric power to the display area A1. For example, the electrical signals generated by the driving circuit unit 150 may be transferred to the display area A1 via the pad units 120. The pad units 120 may be formed of various conductive materials.

The pad units 120 may be electrically connected to the driving circuit unit 150 via the ACF 160. The ACF 160 may include an insulating film 161 and conductive balls 162, e.g., as illustrated in FIG. 2. For example, the conductive balls 162 may be dispersed throughout the insulation film 161.

The insulating layer 115 may be formed on the pad units 120. The insulating layer 115 may include an opening 115a, contact holes 115c, and grooves 115g. The contact hole 115c of the insulating layer 115 may be formed to overlap with an upper surface of the pad unit 120, e.g., each contact hole 115c may overlap one corresponding pad unit 120. The insulating layer 115 may be formed to cover edges of the pad unit 120. Therefore, the possibility of damage to the edges of the pad unit 120 may be reduced and/or prevented. For example, the possibility of damage to side surfaces of the pad units 120 due to, e.g., galvanic corrosion generated during manufacturing processes of the organic light emitting display apparatus 100 or various corrosion generated after manufacturing the organic light emitting display apparatus 100, may be reduced and/or prevented.

Each of the grooves 115g in the insulating layer 115 may be disposed between two contact holes 115c. Referring to FIG. 2, the groove 115g may be formed by removing a part of the insulating layer 115, e.g., by a thickness of the insulating layer 115, by penetrating through the insulating layer 115. However, embodiments are not limited thereto, e.g., the groove 115g may be formed by removing a part of the thickness of the insulating layer 115.

As shown in FIG. 3, side surfaces of the groove 115g may not be exposed in the insulating layer 115. For example, the side surfaces of the groove 115g may be surrounded by the insulating layer 115. Therefore, a coupling force between the insulating layer 115 and the substrate 101 may be improved to, e.g., reduce the possibility of and/or prevent the insulating layer 115 from being separating from the substrate 101. Although not shown in the drawings, if another member is formed between the insulating layer 115 and the substrate 101, the coupling force between the insulating layer 115 and the member disposed under the insulating layer 115 may be reinforced in order to, e.g., reduce the possibility of and/or prevent the isolation of the insulating layer 115.

The driving circuit unit 150 may be disposed on the pad units 120. The driving circuit unit 150 may be, e.g., a chip. The driving circuit unit 150 may include a main body 151 and a plurality of bumps 152. The plurality of bumps 152 may be attached to a lower surface of the main body 151 so as to be in contact with the ACF 160.

The ACF 160 may be disposed between the pad units 120, e.g., that are formed on the substrate 101, and the driving circuit unit 150. Referring to FIG. 2, the ACF 160 may be formed on the insulating layer 115 having the contact holes 115c and the grooves 115g. The ACF 160 may be formed under the bumps 150 of the driving circuit unit 150. The ACF 160 may include the insulating film 161 and the plurality of conductive balls 162.

Some of the conductive balls 162 may be disposed between the bumps 152 and the pad units 120. For example, the bumps 152 may extend into the contact holes 115c so that ones of the conductive balls 162 may be arranged within the contact holes 115c above the pad units 120 and surrounding the bumps 152. When a pressure is applied to the bumps 152 and the pad units 120 through, e.g., a thermocompression bonding process, the conductive balls 162 may break and the pad units 120 and the driving circuit unit 150 may be electrically connected to each other.

In addition, the driving circuit unit 150 may be fixed on the substrate 101 via the ACF 160. For example, the insulating film 161 may be bonded to the insulating layer 115 and the driving circuit unit 150 so that the driving circuit unit 150 may be fixed on the substrate 101.

According to an exemplary embodiment, some of the conductive balls 162 may be received in the grooves 115g. To do this, the groove 115g may be greater in size than the conductive ball 162. For example, the uppermost portion of the groove 115g may be greater in size than the conductive ball 162, e.g., greater in size than a diameter of the conductive ball 162. When the conductive ball 162 is received in the groove 115g, at least a part of the conductive ball 162, e.g., a lower portion of the conductive ball 162, may be received in the groove 115g. The groove 115g may be greater than a predetermined size so that an entire portion of the conductive ball 162 may be received in the groove 115g. Each of the grooves 115g may receive a plurality of the conductive balls 162.

As described above, when the conductive balls 162 between the pad units 120 and the bumps 152 break due to, e.g., the thermocompression bonding process, the pad units 120 and the driving circuit unit 150 may be electrically connected to each other. The conductive balls 162 disposed in other regions than the region between the pad units 120 and the bumps 152 may interfere with the bonding between the driving circuit unit 150 and the substrate 101 due to, e.g., the sizes and volumes thereof. For example, if the conductive balls 162, instead of the insulating film 161, are only disposed in a certain region between the driving circuit unit 150 and the insulating layer 115 (for example if the conductive balls 162 are lumped together) the coupling force between the driving circuit unit 150 and the substrate 101 may be reduced.

In contrast, according to an exemplary embodiment, the grooves 115g may be formed between the contact holes 115c so that the conductive balls 162 may be received in the grooves 115g. For example, the conductive balls 162 in the grooves 115g may be spaced apart from the driving circuit unit 150. Accordingly, the possibility of interference of the conductive balls 162 with the coupling between the driving circuit unit 150 and the substrate 101 may be reduce and/or effectively prevented.

The display area A1 will be described in detail with reference to FIG. 4. A thin film transistor (TFT) may be disposed on the substrate 101. The TFT may include an active layer 103, a gate electrode 105, a source electrode 107, and a drain electrode 108. The TFT may be electrically connected to the first electrode 110.

A buffer layer 102 may be formed on the substrate 101. The buffer layer 102 may provide a flat surface on an upper portion of the substrate 101. The buffer layer 102 may reduce the possibility of and/or prevent moisture and impurities from infiltrating into the substrate 101.

The active layer 103 of a predetermined pattern may be formed on the buffer layer 102. The active layer 103 may be formed of an inorganic semiconductor such as amorphous silicon or polysilicon, or an organic semiconductor, and includes a source region, a drain region, and a channel region. The source and drain regions may be foamed by doping the active layer 103 formed of the amorphous silicon or the polysilicon with impurities. When boron (B), a group 3 element, is doped, a p-type semiconductor may be formed, and when nitrogen (N), a group 5 element, is doped, an n-type semiconductor may be formed.

A gate insulating layer 104 may be formed on the active layer 103, and the gate electrode 105 may be formed on a predetermined region on the gate insulating layer 104. The gate insulating layer 104 may be formed of an organic material or an inorganic material such as a silicon nitride (such as SiNx) and a silicon oxide (such as $SiO_2$), e.g., in order to insulate the active layer 103 from the gate electrode 105.

The gate electrode 105 may be formed of metal such as gold (Au), silver (Ag), copper (Cu), nickel (Ni), platinum (Pt), palladium (Pd), aluminum (Al), molybdenum (Mo), or an alloy thereof such as aluminum:neodymium (Al:Nd) and molybdenum:tungsten (Mo:W). However, embodiments are not limited thereto, e.g., various materials (metals or metal alloys) may be used in consideration of processability.

An interlayer dielectric 106 may be formed on the gate electrode 105. The interlayer dielectric 106 and the gate insulating layer 104 may be formed to expose the source and drain regions of the active layer 103, and the source and drain electrodes 107 and 108 respectively may contact the exposed source and drain regions of the active layer 103.

The source electrode 107 and the drain electrode 108 may be formed of metal such as Au, Pd, Pt, Ni, rhodium (Rh), ruthenium (Ru), iridium (Ir), osmium (Os), Al, Mo, Nd, W, or titanium (Ti), or an alloy of these metals. However, embodiments are not limited thereto, e.g., variously metals and/or metal alloys may be used.

A passivation layer 109 may be formed to cover the source and drain electrodes 107 and 108. The passivation layer 109 may be an inorganic insulating layer and/or an organic insulating layer. The inorganic insulating layer may include at least one of a silicon oxide, e.g., $SiO_2$ or SiON, a silicon nitride (SiNx), an aluminum oxide, e.g., $Al_2O_3$, a titanium oxide, e.g., $TiO_2$, a tantalum oxide, e.g., $Ta_2O_5$, a hafnium oxide, e.g., $HfO_2$, a zirconium oxide, e.g., $ZrO_2$, a barium strontium titanate (BST), and a lead zirconate titanate (PZT). The organic insulating layer may include a general universal polymer such as poly(methyl methacrylate) (PMMA) or polystyrene (PS), a polymer derivative having a phenol group, an acryl-based polymer, an imide-based polymer, an aryl ether-based polymer, an amide-based polymer, a fluoro-based polymer, a p-xylene-based polymer, a vinyl alcohol-based polymer, and a blend thereof. The passivation layer 109 may be formed as a composite stacked layer of the inorganic insulating layer and the organic insulating layer.

The passivation layer 109 may be formed to expose the drain electrode 108, and the first electrode 110 may be connected to the exposed drain electrode 108.

The insulating layer 115 may be disposed on the first electrode 110. The opening 115a of the insulating layer 115 may be formed to overlap with the upper surface of the first electrode 110. The insulating layer 115 may be formed to cover edges of the first electrode 110.

The buffer layer 102, the gate insulating layer 104, the interlayer dielectric 106, and the passivation layer 109 shown in FIG. 4 may be denoted in FIG. 2. That is, referring to FIG. 2, the insulating layer 115 may be formed to contact the substrate 101. However, embodiments are not limited thereto, e.g., all of the buffer layer 102, the gate insulating layer 104, the interlayer dielectric 106, and the passivation layer 109 may be formed on the lower portion of the insulating layer 115, otherwise at least one of these layers may be formed.

The intermediate layer 112 may be formed to correspond to the opening 115a. The intermediate layer 112 may contact the upper surface of the first electrode 110. The second electrode 116 may be disposed on the intermediate layer 112.

The intermediate layer 112 may include an organic emission layer (not shown) and may emit visible rays when a voltage is applied thereto through the first and second electrodes 110 and 116.

A sealing member (not shown) may be disposed to face a surface of the substrate 101. The sealing member (not shown) may be formed to, e.g., protect the intermediate layer 112 from external moisture or oxygen, and may be formed of glass, plastic, or other organic and inorganic materials.

In the organic light emitting display apparatus 100, the insulating layer 115 may be disposed on the pad units 120 and may include the grooves 115g between the contact holes 115c. The conductive balls 162 may be received in the grooves 115g. Therefore, the possibility of interference of the conductive balls 162 with the coupling between the driving circuit unit 150 and the substrate 101 may be reduced and/or effectively prevented. Consequently, a firm coupling between the substrate 101 and the driving circuit unit 150 may be realized, e.g., easily realized, to, e.g., improve the durability of the organic light emitting display apparatus 100.

The insulating layer 115 may cover the edges of the pad units 120 to, e.g., reduce the possibility of and/or prevent damage to the edges of the pad units 120. Side surfaces of the grooves 115g may be surrounded by the insulating layer 115 to, e.g., improve the coupling force between the insulating layer 115 and the lower layers. Accordingly, the durability of the organic light emitting display apparatus 100 may be improved.

Figure 5:
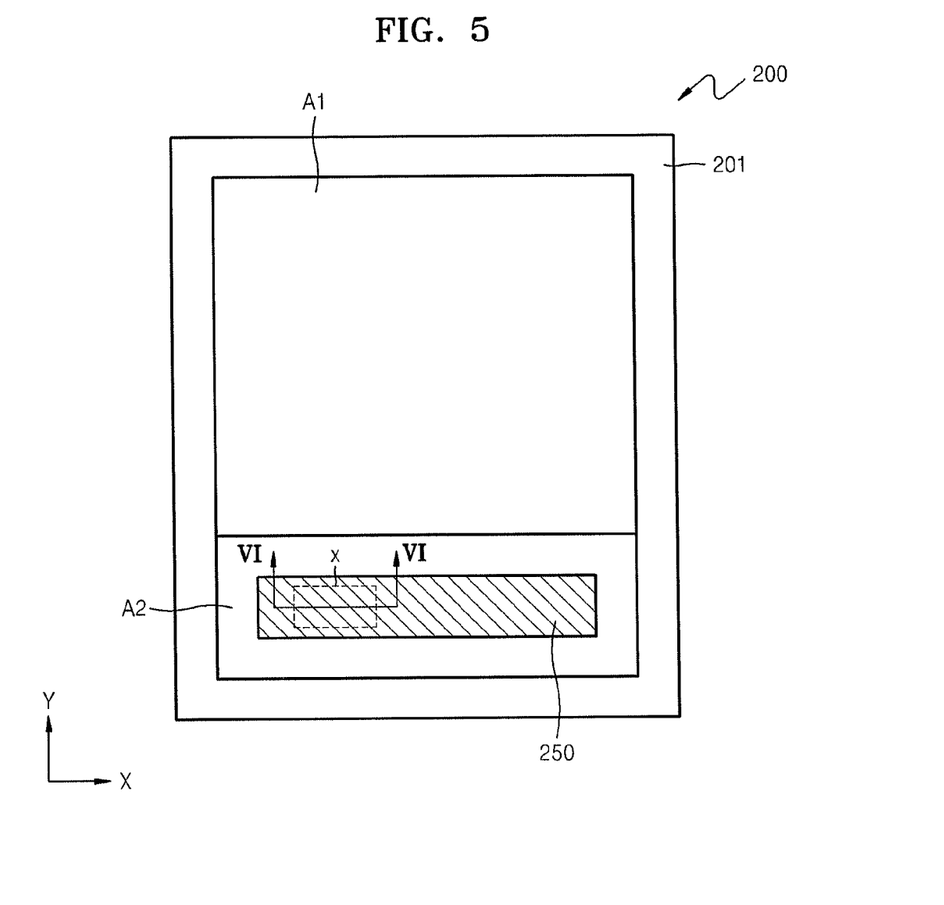
FIG. 5 illustrates a schematic plan view of an organic light-emitting display apparatus, according to an exemplary embodiment.
Figure 6:
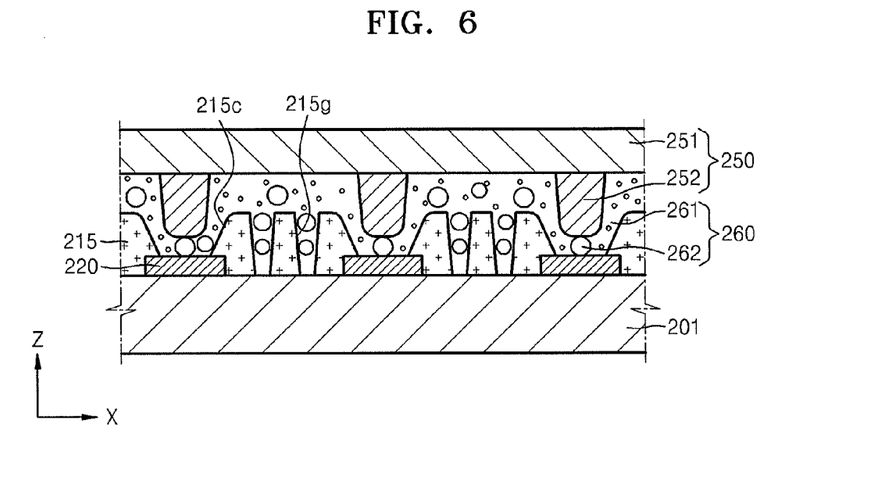
FIG. 6 illustrates a cross-sectional view of the organic light-emitting display apparatus taken along line VI-VI of FIG. 5.
Figure 7:
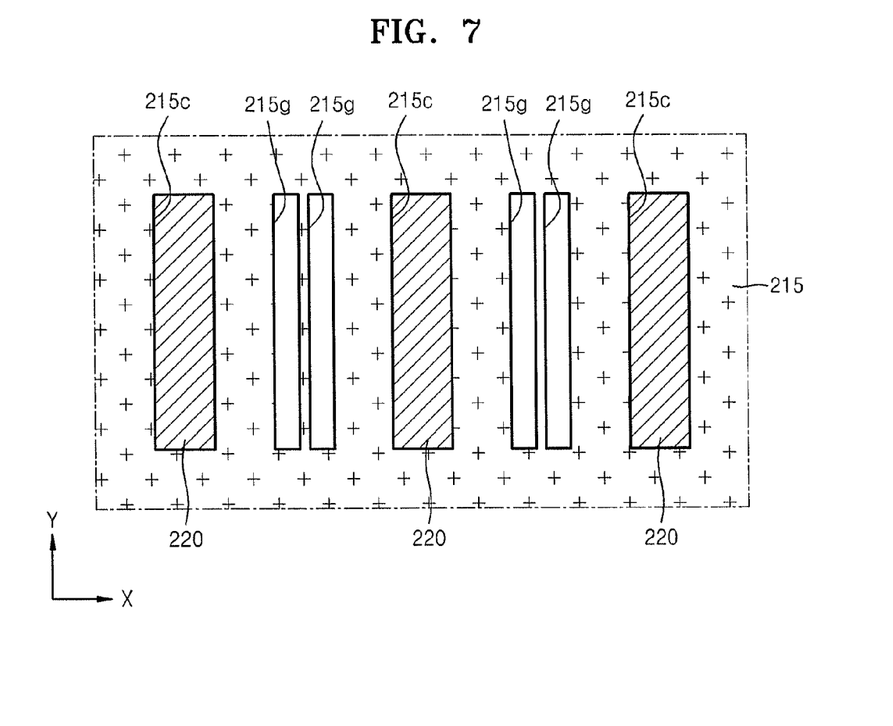
FIG. 7 illustrates an expanded view of a region X shown in FIG. 5.

FIG. 5 illustrates a schematic plan view of an organic light emitting display apparatus 200 according to another exemplary embodiment, FIG. 6 illustrates a cross-sectional view of the organic light emitting display apparatus 200 taken along line VI-VI of FIG. 5, and FIG. 7 illustrates an expanded view of a region X shown in FIG. 5.

Referring to FIGS. 5 through 7, the organic light emitting display apparatus 200 may include a substrate 201, a first electrode (not shown), an intermediate layer (not shown), a second electrode (not shown), pad units 220, an insulating layer 215, a driving circuit unit 250, and an ACF 260. Hereinafter, differences from the components of the previous embodiment will be mainly described for the convenience of description.

A display area A1 and a non-display area A2 are defined on the substrate 201. Referring to FIG. 5, the non-display area A2 is disposed on a side of the display area A1. However, embodiments are not limited thereto, e.g., the non-display area A2 may be disposed on sides of the display area A1 that face each other, or may be disposed to surround the display area A1.

The display area A1 may include a plurality of sub-pixels (not shown) that emit visible rays that a user may recognize. Each of the sub-pixels may include the first electrode (not shown), the intermediate layer (not shown), and the second electrode (not shown) formed therein. Detailed descriptions thereof are not provided here.

A plurality of pad units 220 may be disposed on the non-display area A2. The pad units 220 may transmit electrical signals or electric power to the display area A1. For example, electrical signals generated by the driving circuit unit 250 may be transferred to the display area A1 via the pad units 220.

The pad units 220 may be electrically connected to the driving circuit unit 250 via the ACF 260. The ACF 260 may include an insulating film 261 and conductive balls 262.

The insulating layer 215 may be disposed on the pad units 220. The insulating layer 215 may include an opening (not shown), contact holes 215c, and grooves 215g. The opening (not shown) may be formed to overlap with the first electrode (not shown).

The contact holes 215c of the insulating layer 215 may overlap with upper surfaces of the pad units 220. The insulating layer 215 may be formed to cover edges of the pad units 220. Thus, e.g., the possibility of damage to the edges of the pad units 220 may be reduced and/or prevented.

A plurality of the grooves 215g of the insulating layer 215 may be disposed between two adjacent contact holes 215c. In FIG. 6, two grooves 215g are disposed between two adjacent contact holes 215c. However, embodiments are not limited thereto, e.g., three or more grooves 215g may be disposed between two adjacent contact holes 215c.

Referring to FIG. 6, the grooves 215g may be formed by removing the entire thickness of the insulating layer 215, e.g., by penetrating through the insulating layer 215. However, embodiments are not limited thereto, e.g., the grooves 215g may be formed by removing a part of the thickness of the insulating layer 215.

As shown in FIG. 7, side surfaces of the grooves 215g may not be exposed in the insulating layer 215. For example, the side surfaces of the grooves 215g may be surrounded by the insulating layer 215. Therefore, e.g., a coupling force between the insulating layer 215 and the lower layers may be improved.

The driving circuit unit 250 may be disposed on the pad units 220. The driving circuit unit 250 may include a main body 251 and a plurality of bumps 252. The plurality of bumps 252 may be attached to a lower surface of the main body 251.

The ACF 260 may be disposed between the pad units 220 and the driving circuit unit 250. Referring to FIG. 6, the ACF 260 may be formed on the insulating layer 215. The ACF 260 may include an insulating film 261 and a plurality of conductive balls 262 dispersed throughout the insulating film 261.

Some of the conductive balls 262 may be disposed between the bumps 252 and the pad units 220. Some of the other conductive balls 262 may be received in the grooves 215g. The grooves 215g may be greater in size than the conductive balls 262. In particular, the uppermost portion of the groove 215g may be greater in size than the conductive ball 262, e.g., than a diameter of the conductive ball 262. When the conductive balls 262 are received in the grooves 215g, a part of the conductive ball 262, e.g., a lower portion of the conductive ball 262, may be received in the groove 215g. However, the grooves 215g may be formed to be greater than a predetermined size so that the conductive balls 262 may be received entirely in the grooves 215g.

The plurality of grooves 215g may be formed between the contact holes 215c so that the conductive balls 262 may be effectively received in the grooves 215g. Therefore, the possibility of interference of the conductive balls 262 with the coupling between the driving circuit unit 250 and the substrate 201 may be reduced and/or effectively prevented.

Figure 8:
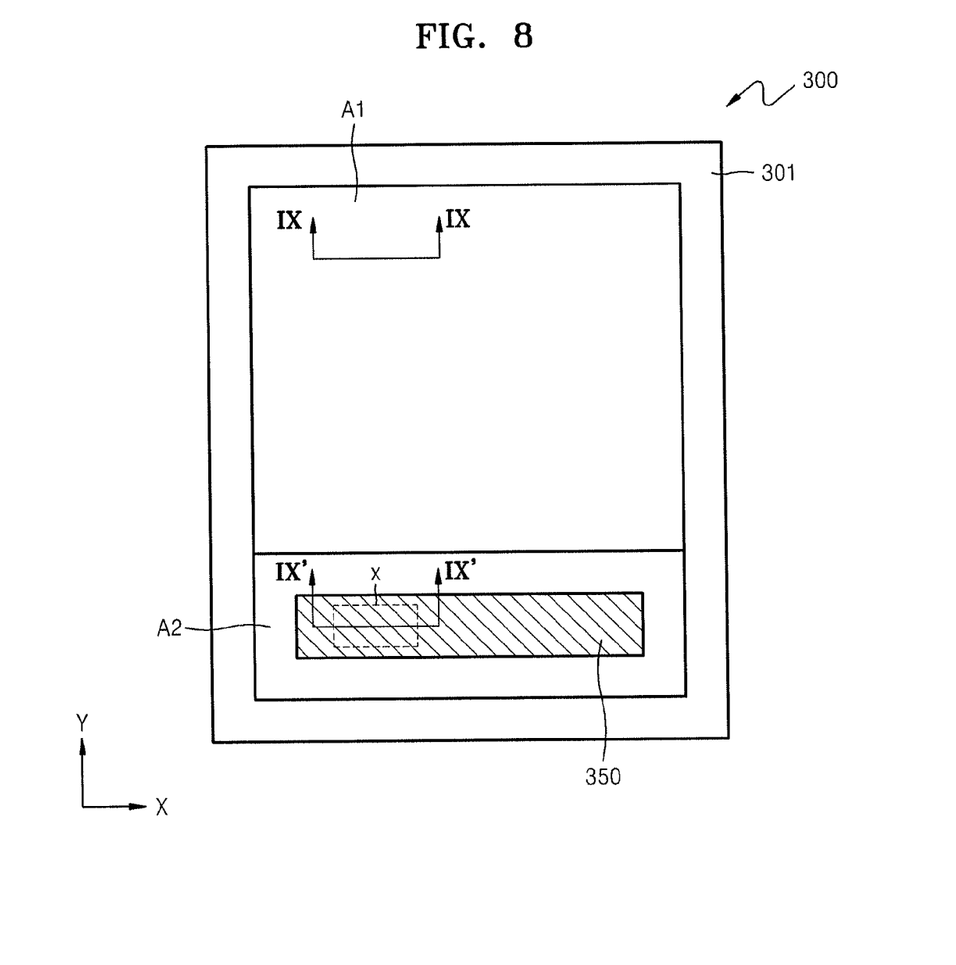
FIG. 8 illustrates a schematic plan view of an organic light emitting display apparatus, according to an exemplary embodiment.
Figure 9:
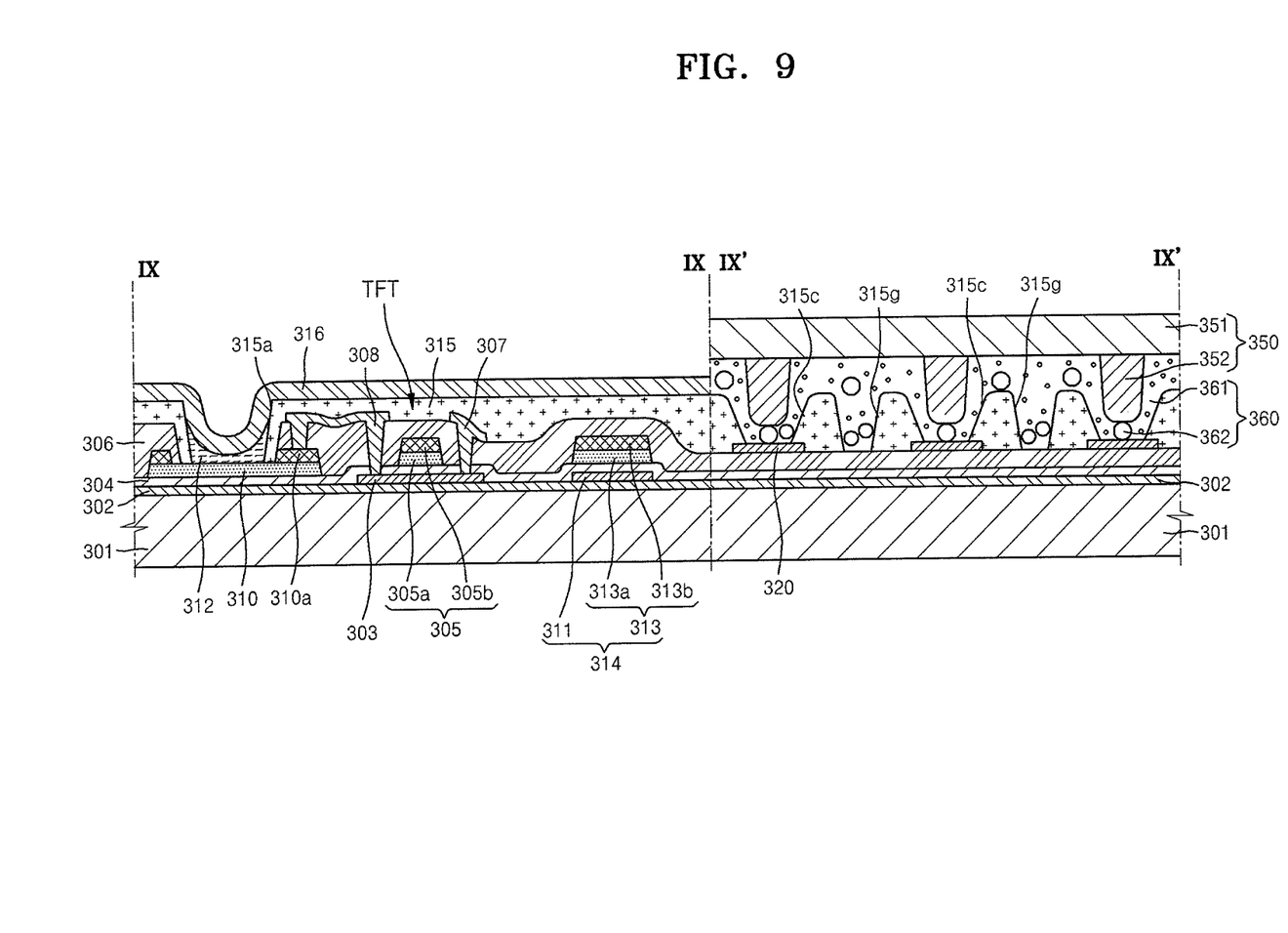
FIG. 9 illustrates a cross-sectional view of the organic light emitting display apparatus taken along lines IX-IX and IX'-IX' of FIG. 8.
Figure 10:
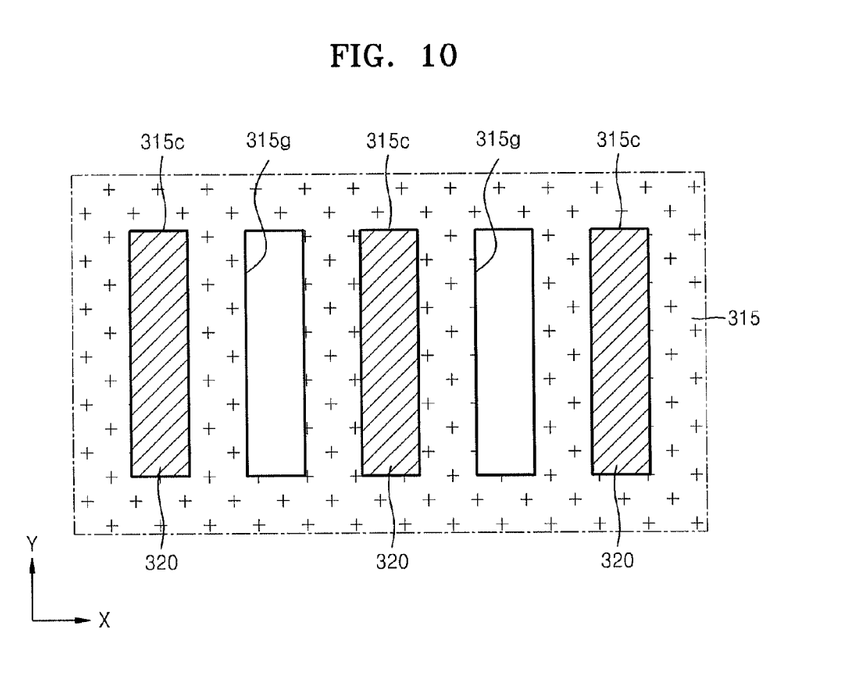
FIG. 10 illustrates an expanded view of a region X shown in FIG. 8.

FIG. 8 illustrates a schematic plan view of an organic light emitting display apparatus 300 according to another exemplary embodiment, FIG. 9 illustrates a cross-sectional view of the organic light emitting display apparatus 300 taken along lines IX-IX and IX'-IX' of FIG. 8, and FIG. 10 illustrates an expanded view of a region X shown in FIG. 8. For the convenience of description, differences from the previous embodiments will now be mainly described.

Referring to FIGS. 8 through 10, the organic light emitting display apparatus 300 may include a substrate 301, a first electrode 310, an intermediate layer 312, a second electrode 316, pad units 320, an insulating layer 315, a driving circuit unit 350, and an ACF 360.

A display area A1 and a non-display area A2 may be defined on the substrate 301. Referring to FIG. 8, the non-display area A2 may be disposed on a side of the display area A1. However, embodiments are not limited thereto, e.g., the non-display area A2 may be disposed on sides of the display area A1 that face each other, or may be disposed to surround the display area A1.

The display area A1 may include a plurality of sub-pixels (not show) that emit visible rays that a user may recognize. Each of the sub-pixels may include the first electrode 310, the intermediate layer 312, and the second electrode 316. A TFT that is electrically connected to the first electrode 310 may be disposed on the display area A1. The TFT may include an active layer 303, a gate electrode 305, a source electrode 307, and a drain electrode 308. A capacitor 314 may be disposed on the display area A1, and the capacitor 314 may include a first capacitor electrode 311 and a second capacitor electrode 313, as described in more detail below.

The non-display area A2 may include the pad units 320. The pad units 320 may transmit electrical signals or electric power to the display area A1. For example, the electrical signals generated by the driving circuit unit 350 may be transferred to the display area A1 via the pad units 320.

The pad units 320 may be electrically connected to the driving circuit unit 350 via the ACF 360. The ACF 360 may include an insulating film 361 and conductive balls 362, which are described in more detail below.

A buffer layer 302 may be formed on the substrate 301. The buffer layer 302 may be formed throughout the display area A1 and the non-display area A2.

The active layer 303 may be formed on the buffer layer 302. The first capacitor electrode 311 may be formed on the buffer layer 302. The first capacitor electrode 311 may be formed of the same material as that of the active layer 303.

A gate insulating layer 304 may be formed on the buffer layer 302 to, e.g., cover the active layer 303 and the first capacitor electrode 311. The gate insulating layer 304 may be formed throughout the display area A1 and the non-display area A2.

The gate electrode 305, the first electrode 310, and the second capacitor electrode 313 may be formed on the gate insulating layer 304.

The gate electrode 305 may include a first conductive layer 305a and a second conductive layer 305b. The first conductive layer 305a may include a transparent conductive material, e.g., at least one of indium tin oxide (ITO), indium zinc oxide (IZO), zinc oxide (ZnO), indium oxide ($In_2O_3$), indium gallium oxide (IGO), and aluminum zinc oxide (AZO). The second conductive layer 305b may be formed on the first conductive layer 305a, while including metal or a metal alloy such as, e.g., Mo, MoW, or Al-based alloy. However, embodiments are not limited thereto.

The first electrode 310 may include a transparent conductive material, e.g., may be formed of the same material as that of the first conductive layer 305a of the gate electrode 305. The first electrode 310 and the first conductive layer 305a may be simultaneously foamed. A conductive unit 310a may be disposed on a predetermined upper portion of the first electrode 310. The conductive unit 310a may be formed of the same material as that of the second conductive layer 305b of the gate electrode 305. The conductive unit 310a and the second conductive layer 305b may be simultaneously formed.

The second capacitor electrode 313 may include a first layer 313a and a second layer 313b. The first layer 313a of the second capacitor electrode 313 may be formed of the same material as that of the first conductive layer 305a of the gate electrode 305, e.g., may be simultaneously formed. The second layer 313b of the second capacitor electrode 313 may be formed of the same material as that of the second conductive layer 305b of the gate electrode 305, e.g., may be simultaneously formed.

An interlayer dielectric 306 may be formed on the first electrode 310, the gate electrode 305, and the second capacitor electrode 313. The interlayer dielectric 306 may include various insulating materials such as organic and/or inorganic materials. The interlayer dielectric 306 may be formed throughout the display area A1 and the non-display area A2.

The source electrode 307 and the drain electrode 308 may be formed on the interlayer dielectric 306 located on the display area A1. The source and drain electrodes 307 and 308 may be connected to the active layer 303.

One of the source electrode 307 and the drain electrode 308 may be electrically connected to the first electrode 310, and FIG. 9 shows that the drain electrode 308 may be electrically connected to the first electrode 310. The drain electrode 308 may contact the conductive unit 310a.

The pad units 320 may be disposed on the interlayer dielectric 306 located on the non-display area A2. The pad units 320 may be formed of various conductive materials, e.g., may be formed of the same material as that of the source electrode 307 or the drain electrode 308. The pad units 320 may be patterned simultaneously with the source electrode 307 and/or the drain electrode 308.

The insulating layer 315 may be formed on the interlayer dielectric 306 to cover the TFT. The insulating layer 315 may include an opening 315a, which overlaps with a predetermined region of an upper surface of the first electrode 310.

The intermediate layer 312 may be formed to correspond to the opening 315a. The second electrode 316 may be formed on the intermediate layer 312.

The insulating layer 315 may also be formed on the pad units 320. The insulating layer 315 may include contact holes 315c and grooves 315g.

The contact holes 315c in the insulating layer 315 may be formed to overlap with upper surfaces of the pad units 320. The insulating layer 315 may cover edges of the pad units 320. Thus, the possibility of damage to the edges of the pad units 320 may be reduced and/or prevented. For example, the possibility of damage to side surfaces of the pad units 320 due to, e.g., galvanic corrosion generated during manufacturing processes of the organic light emitting display apparatus 300 or various corrosion generated after manufacturing the organic light emitting display apparatus 300, may be reduced and/or prevented.

The grooves 315g of the insulating layer 315 may be disposed between two adjacent contact holes 315c. Referring to FIG. 9, the grooves 315g may be formed by removing the entire thickness of the insulating layer 315, e.g., by penetrating through the insulating layer 315. However, embodiments are not limited thereto, e.g., the grooves 315g may be formed by removing a part of the entire thickness of the insulating layer 315. As shown in FIG. 6, a plurality of grooves 315g may be disposed between two adjacent contact holes 315c.

As shown in FIG. 9, side surfaces of the grooves 315g may not be exposed in the insulating layer 315. For example, the side surfaces of the grooves 315g may be surrounded by the insulating layer 315. Thus, e.g., the bonding force between the insulating layer 315 and the substrate 301 may be improved to reduce the possibility of and/or prevent the insulating layer 315 from separating from the substrate 301. Although not shown in the drawings, when other members are formed between the insulating layer 315 and the substrate 301, the coupling force between the insulating layer 315 and the lower layers may be strengthened in order to, e.g., reduce the possibility of and/or prevent the separation of the insulating layer 315.

The driving circuit unit 350 may be disposed on the pad units 320. The driving circuit unit 350 may be a chip, and may include a main body 351 and a plurality of bumps 352. The plurality of bumps 352 may be attached to a lower surface of the main body 351.

The ACF 360 may be disposed between the pad units 320 and the driving circuit unit 350. The ACF 360 may be formed on the insulating layer 315. The ACF 360 may include the insulating film 361 and the conductive balls 362.

Some of the conductive balls 362 may be disposed between the bumps 352 and the pad units 320. According to an exemplary embodiment, when a pressure is applied to the bumps 352 and the pad units 320 through, e.g., a thermocompression bonding process, the conductive balls 362 may break so that the pad units 320 and the driving circuit unit 350 may be electrically connected to each other.

The driving circuit unit 350 may be fixed on the substrate 301 via the ACF 360. The insulating film 361 may be bonded to the insulating layer 315 and the driving circuit unit 350 so that the driving circuit unit 350 is fixed on the substrate 301.

Some of the conductive balls 362 may be received in the grooves 315g. To do this, e.g., the grooves 315g may be greater in size than the conductive balls 362. Each of the grooves 315g may receive a plurality of conductive balls 362 therein.

Although not shown in the drawings, a sealing member (not shown) may be disposed on an upper portion of the second electrode 316 to face a surface of the substrate 301. The sealing member (not shown) may be formed to, e.g., protect the intermediate layer 312 from external moisture or oxygen. The sealing member may be formed of glass or plastic, or may have a stacked structure including an organic material and an inorganic material.

In the organic light emitting display apparatus 300, the insulating layer 315 may be disposed on the pad units 320 and may include the grooves 315g between the contact holes 315c. The grooves 315g may receive the conductive balls 362. Accordingly, the possibility of interference of the conductive balls 362 with the coupling between the driving circuit unit 350 and the substrate 301 may be effectively reduced and/or prevented. Consequently, the substrate 301 and the driving circuit unit 350 may be firmly coupled to each other and thus, e.g., improving the durability of the organic light emitting display apparatus 300.

The insulating layer 315 may be formed to cover edges of the pad units 320 to, e.g., reduce the possibility of and/or prevent damage to the edges of the pad units 320.

Side surfaces of the grooves 315g may be surrounded by the insulating layer 315 to, e.g., improve the coupling force between the insulating layer 315 and the lower layers. Thus, the durability of the organic light emitting display apparatus 300 may be improved.

The pad units 320 may be formed simultaneously with the source electrode 307 or the drain electrode 308, and thus, manufacturing processes of the organic light emitting display apparatus 300 may be simplified and the thickness of the organic light emitting display apparatus 300 may be reduced.

The first electrode 310 may be formed of the same material as that of the first conductive layer 305a of the gate electrode 305, using the same layer as the first conductive layer 305a. Thus, the manufacturing processes of the organic light emitting display apparatus 300 may be simplified, and defects generated during the forming of the first electrode 310 and the gate electrode 305 may be reduced. In addition, the thickness of the organic light emitting display apparatus 300 may be reduced easily.

By way of summation and review, an organic light emitting display apparatus may include an intermediate layer, a first electrode, and a second electrode. The intermediate layer may include an organic emission layer, and when a voltage is applied to the first and second electrodes, the organic emission layer may emit visible light rays. The organic light emitting display apparatus may include a driving circuit unit that generates electrical signals, and a pad unit that transmits the signals generated by the driving circuit unit. However, it may not be easy to bond the driving circuit unit and the pad unit to each other. As such, a coupling property between the driving circuit unit and the pad unit and/or a coupling property between the driving circuit unit and a substrate of the organic light emitting display apparatus may be degraded and there is a limitation in improving the durability of the organic light emitting display apparatus.

In contrast, embodiments, e.g., the exemplary embodiments discussed above, relate to an organic light emitting display apparatus in which the durability of the organic light emitting display apparatus may be enhanced, e.g., easily enhanced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting display apparatus, comprising:
    a substrate on which a display area and a non-display area are defined;
    a first electrode on the substrate;
    an intermediate layer on the first electrode, the intermediate layer including an organic emission layer;
    a second electrode on the intermediate layer;
    a plurality of pad units on the non-display area; and
    an insulating layer on the pad units, the insulating layer including contact holes overlapping upper surfaces of the pad units and grooves adjacent to the contact holes.

2. The organic light emitting display apparatus of claim 1, wherein at least one of the grooves is arranged between two adjacent ones of the contact holes.

3. The organic light emitting display apparatus of claim 1, further comprising:
    a driving circuit unit on the insulating layer and electrically connected to the pad units via the contact holes; and
    an anisotropic conductive film between the insulating layer and the driving circuit unit.

4. The organic light emitting display apparatus of claim 3, wherein the anisotropic conductive film includes an insulating film and conductive balls, and a size of an uppermost portion of each groove is greater than a size of the conductive balls.

5. The organic light emitting display apparatus of claim 3, wherein the anisotropic conductive film includes an insulating film and conductive balls, and at least one of the conductive balls is received in one of the grooves.

6. The organic light emitting display apparatus of claim 3, wherein:
    the driving circuit unit includes bumps, and
    the anisotropic conductive film includes an insulating film and conductive balls, ones of the conductive balls being arranged between the bumps and the upper surfaces of the pad units.

7. The organic light emitting display apparatus of claim 1, wherein the grooves extend through the insulating layer.

8. The organic light emitting display apparatus of claim 1, wherein the grooves extend though the insulating layer by a predetermined thickness of the insulating layer.

9. The organic light emitting display apparatus of claim 1, wherein side surfaces of the grooves are surrounded by the insulating layer.

10. The organic light emitting display apparatus of claim 1, wherein the insulating layer covers edges of the pad units.

11. The organic light emitting display apparatus of claim 1, wherein a plurality of the grooves are disposed between two adjacent ones of the contact holes.

12. The organic light emitting display apparatus of claim 1, wherein the insulating layer includes an opening that overlaps an upper surface of the first electrode, and the intermediate layer is arranged to correspond to the opening.

13. The organic light emitting display apparatus of claim 1, further comprising a thin film transistor on the substrate and electrically connected to the first electrode, the thin film transistor including an active layer, a source electrode, a drain electrode, and a gate electrode.

14. The organic light emitting display apparatus of claim 13, wherein the pad units are formed of a material that is the same as the material forming the source electrode or the drain electrode, and are formed from the same layer as the one of the source electrode or the drain electrode.

15. The organic light emitting display apparatus of claim 13, wherein the first electrode and the gate electrode are on the same layer.

16. The organic light emitting display apparatus of claim 15, wherein the gate electrode includes a first conductive layer and a second conductive layer on the first conductive layer, and the first electrode is formed of the same material as a material forming the first conductive layer.

17. The organic light emitting display apparatus of claim 1, wherein the first electrode includes a transparent conductive material.

* * * * *